US011482420B2

(12) United States Patent
 Zhou

(10) Patent No.: US 11,482,420 B2
(45) Date of Patent: Oct. 25, 2022

(54) SEMICONDUCTOR DEVICE HAVING A DUMMY GATE WITH A CUT-OUT OPENING BETWEEN ADJACENT FINS AND METHODS OF FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/866,911

(22) Filed: May 5, 2020

(65) Prior Publication Data
 US 2020/0350171 A1 Nov. 5, 2020

(30) Foreign Application Priority Data
 May 5, 2019 (CN) .......................... 201910368379.4

(51) Int. Cl.
 *H01L 21/28* (2006.01)
 *H01L 29/78* (2006.01)
 (Continued)

(52) U.S. Cl.
 CPC .. *H01L 21/28123* (2013.01); *H01L 21/31116* (2013.01); *H01L 21/76224* (2013.01);
 (Continued)

(58) Field of Classification Search
 CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 21/823437; H01L 21/823828; H01L 21/28123; H01L 29/66545; H01L 21/823481;
 (Continued)

(56) References Cited

U.S. PATENT DOCUMENTS 10,083,874 B1 * 9/2018 Yu ................... H01L 21/823431
2016/0307767 A1 * 10/2016 Lee ................. H01L 21/823821
 (Continued)

*Primary Examiner* — Younes Boulghassoul
(74) *Attorney, Agent, or Firm* — Anova Law Group, PLLC

(57) ABSTRACT

Semiconductor device and fabrication method are provided. A plurality of spaced-apart fins is formed on a substrate. A dummy gate structure is formed across the fins over the substrate. A first interlayer dielectric layer is formed on the substrate and on a sidewall of the dummy gate structure, and a top of the first interlayer dielectric layer is lower than a top of the dummy gate structure and higher than a top of the fins. A cut-out opening, according to a cut-out pattern, is formed through the dummy gate structure and between adjacent fins. A second interlayer dielectric layer is formed on the first interlayer dielectric layer and fills in the cut-out opening.

19 Claims, 13 Drawing Sheets

(51) Int. Cl.
*H01L 29/49* (2006.01)
*H01L 29/66* (2006.01)
*H01L 21/311* (2006.01)
*H01L 21/8234* (2006.01)
*H01L 21/762* (2006.01)

(52) U.S. Cl.
CPC ............... *H01L 21/823437* (2013.01); *H01L 21/823468* (2013.01); *H01L 21/823481* (2013.01); *H01L 29/4983* (2013.01); *H01L 29/6656* (2013.01); *H01L 29/66545* (2013.01); *H01L 29/66795* (2013.01); *H01L 29/785* (2013.01); *H01L 29/7851* (2013.01)

(58) Field of Classification Search
CPC ....... H01L 21/823878; H01L 21/76224; H01L 21/823468; H01L 21/823864; H01L 29/6653; H01L 29/66553; H01L 29/6656; H01L 29/42376
See application file for complete search history.

(56) References Cited

U.S. PATENT DOCUMENTS

| | | | |
|---|---|---|---|
| 2017/0125411 A1* | 5/2017 | Yu | H01L 29/66545 |
| 2017/0345820 A1* | 11/2017 | Lin | H01L 29/66818 |
| 2018/0233579 A1* | 8/2018 | Li | H01L 21/76224 |
| 2018/0261606 A1* | 9/2018 | Zhou | H01L 21/823828 |
| 2019/0131429 A1* | 5/2019 | Shu | H01L 29/66545 |
| 2019/0341468 A1* | 11/2019 | Zang | H01L 29/6656 |
| 2020/0266286 A1* | 8/2020 | Yang | H01L 27/092 |

* cited by examiner

SEMICONDUCTOR DEVICE HAVING A DUMMY GATE WITH A CUT-OUT OPENING BETWEEN ADJACENT FINS AND METHODS OF FORMING THE SAME

CROSS-REFERENCES TO RELATED APPLICATION

This application claims the priority of Chinese Patent Application No. 201910368379.4, filed on May 5, 2019, the content of which is incorporated by reference in its entirety.

TECHNICAL FIELD

The present disclosure generally relates to the field of semiconductor technology and, more particularly, to a semiconductor device and a method of forming the same.

BACKGROUND

With the rapid development of semiconductor manufacturing technology, semiconductor devices are being developed with an increasingly high density of components and integration. However, conventional planar devices have poor control over channel current, produce a short-channel effect, and cause current leakage, which ultimately affects the electrical performance of semiconductor devices.

In order to overcome the short-channel effect of a device and suppress current leakage, fin field-effect transistors (Fin FET) have been developed. Fin FETs are commonly used devices. The structure of a fin FET includes: a fin and an isolation structure located on the surface of a semiconductor substrate, the isolation structure covering part of the sidewall of the fin, and the surface of the isolation structure being lower than the top of the fin; a gate structure located on the surface of the isolation structure, on the top of the fin, and on the surface of the sidewall; and source and drain regions in the fin on both sides of the gate structure.

However, as the size of semiconductor devices reduces and the density of devices increases, the process of forming fin FETs becomes increasingly difficult, and the performance of the formed fin FETs is also unstable.

SUMMARY

One aspect of the present disclosure provides a method of forming a semiconductor device. In the method, a plurality of spaced-apart fins is formed on a substrate. A dummy gate structure is formed across the fins over the substrate. A first interlayer dielectric layer is formed on the substrate and on a sidewall of the dummy gate structure, and a top of the first interlayer dielectric layer is lower than a top of the dummy gate structure and higher than a top of the fins. A cut-out opening, according to a cut-out pattern, is formed through the dummy gate structure and between adjacent fins. A second interlayer dielectric layer is formed on the first interlayer dielectric layer and fills in the cut-out opening.

Another aspect of the present disclosure includes a semiconductor device, including: a substrate; a plurality of spaced-apart fins on the substrate; a dummy gate structure across the fins over the substrate, and the dummy gate structure including a cut-out opening between adjacent fins; a first interlayer dielectric layer on the substrate and on a sidewall of the dummy gate structure, and a top of the first interlayer dielectric layer being lower than a top of the dummy gate structure and higher than a top of the fins; and a second interlayer dielectric layer on the first interlayer dielectric layer and filling in the cut-out opening through the dummy gate structure between the adjacent fins.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
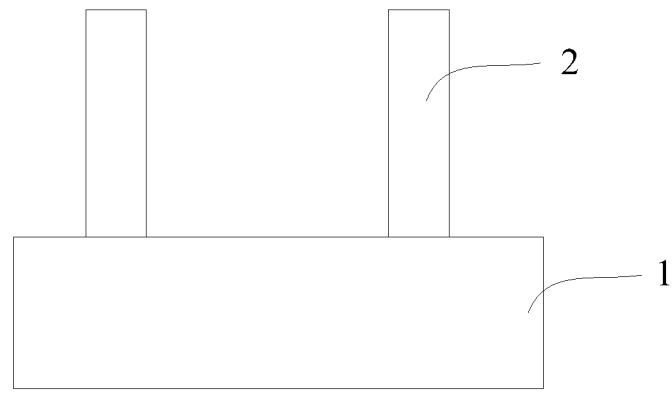
FIGS. 1-6 illustrate structures during formation of a semiconductor device.
Figure 2:
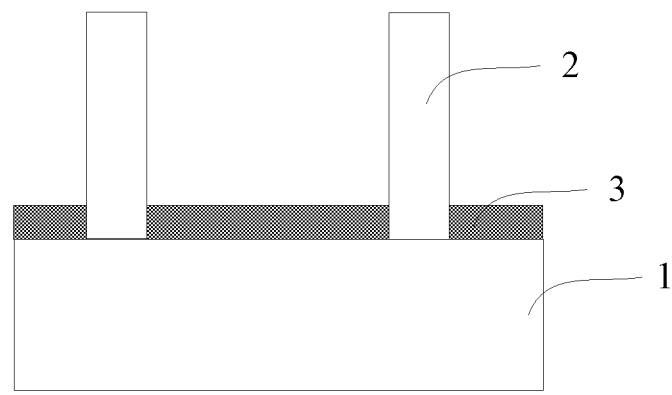
Figure 3:
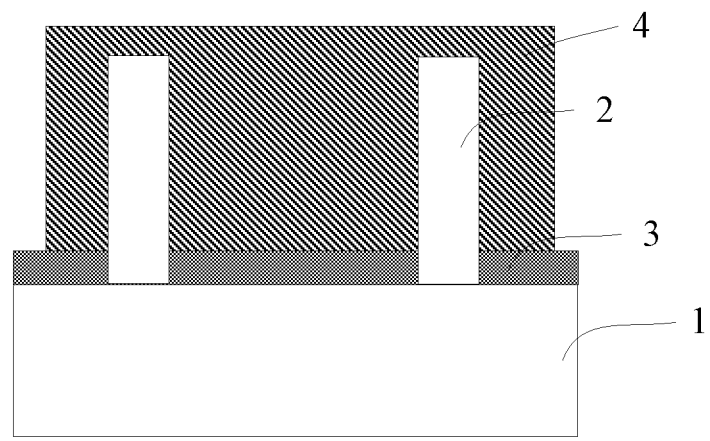
Figure 4:
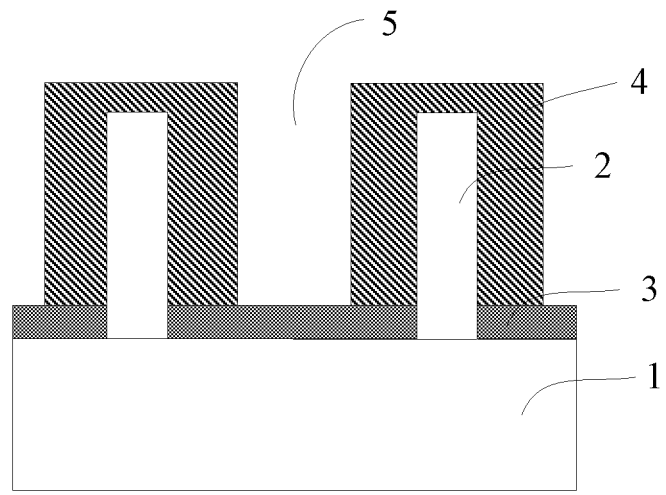
Figure 5:
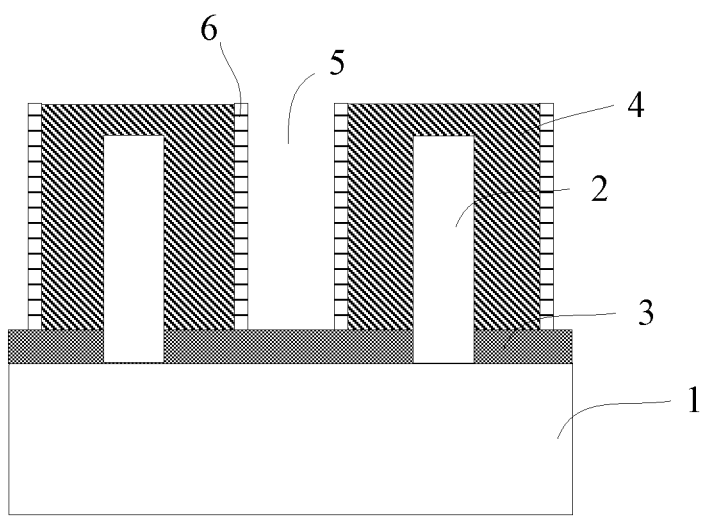
Figure 6:
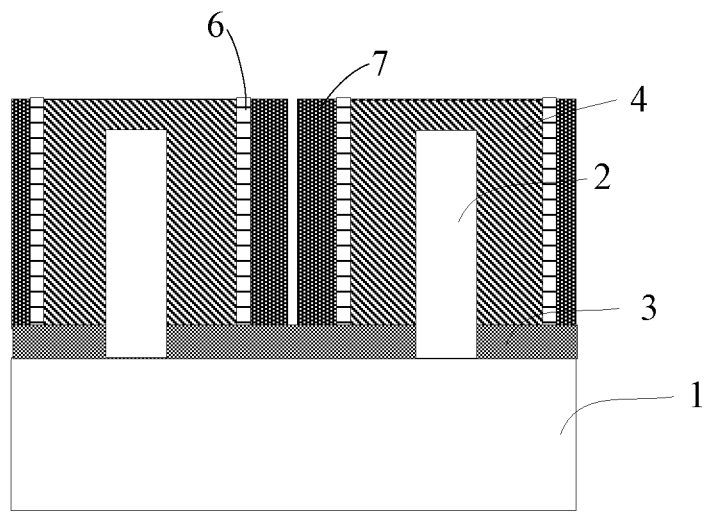

FIGS. 1-6 illustrate structures during formation of a semiconductor device that has poor stability. In FIG. 1, a substrate 1 is provided, and a plurality of spaced-apart fins 2 are formed on the substrate. In FIG. 2, an isolation structure 3 is formed on the substrate 1. In FIG. 3, a dummy gate structure 4 is formed on the substrate 1, and the dummy gate structure 4 spans across the fins 2. In FIG. 4, a portion of the dummy gate structure 4 between adjacent fins 2 is etched, and a cut-out opening 5 is formed inside the dummy gate structure 4. In FIG. 5, a plurality of sidewall spacers 6 are formed on sidewalls of the cut-out opening 5 and sidewalls of the dummy gate structure 4. In FIG. 6, an interlayer dielectric layer 7 is filled in the cut-out opening 5.

When the interlayer dielectric layer 7 is formed in the cut-out opening 5 by the above method, the interlayer dielectric layer 7 is more likely to adhere to the sidewall spacers 6 on the sidewalls of the cut-out opening 5. Further, the interlayer dielectric layer 7 formed in the cut-out opening 5 tend to have holes, so that bridging problems are likely to occur during the use of semiconductors, which affects the performance of semiconductor devices.

It is found that after forming the cut-out opening inside the dummy gate structure but before forming the sidewall spacers on the sidewalls of the dummy gate structure, depositing the interlayer dielectric layer in the cut-out opening can fully fill in the cut-out opening without the formation of holes, which can eliminate the bridging problem occurred during filling the cut-out opening with the interlayer dielectric layer, thereby improving the performance and stability of the semiconductor device.

It is also found that after forming the cut-out opening, it is easy to form a thin insulating layer on the sidewalls of the cut-out opening. Due to the presence of the insulating layer, the distance between a contact plug and a metal gate can also be increased, thereby improving the stability of semiconductor devices.

To better clarify the aforementioned objects, features, and advantages of the present disclosure, embodiments are given below to elaborate on the present disclosure.

Figure 27:
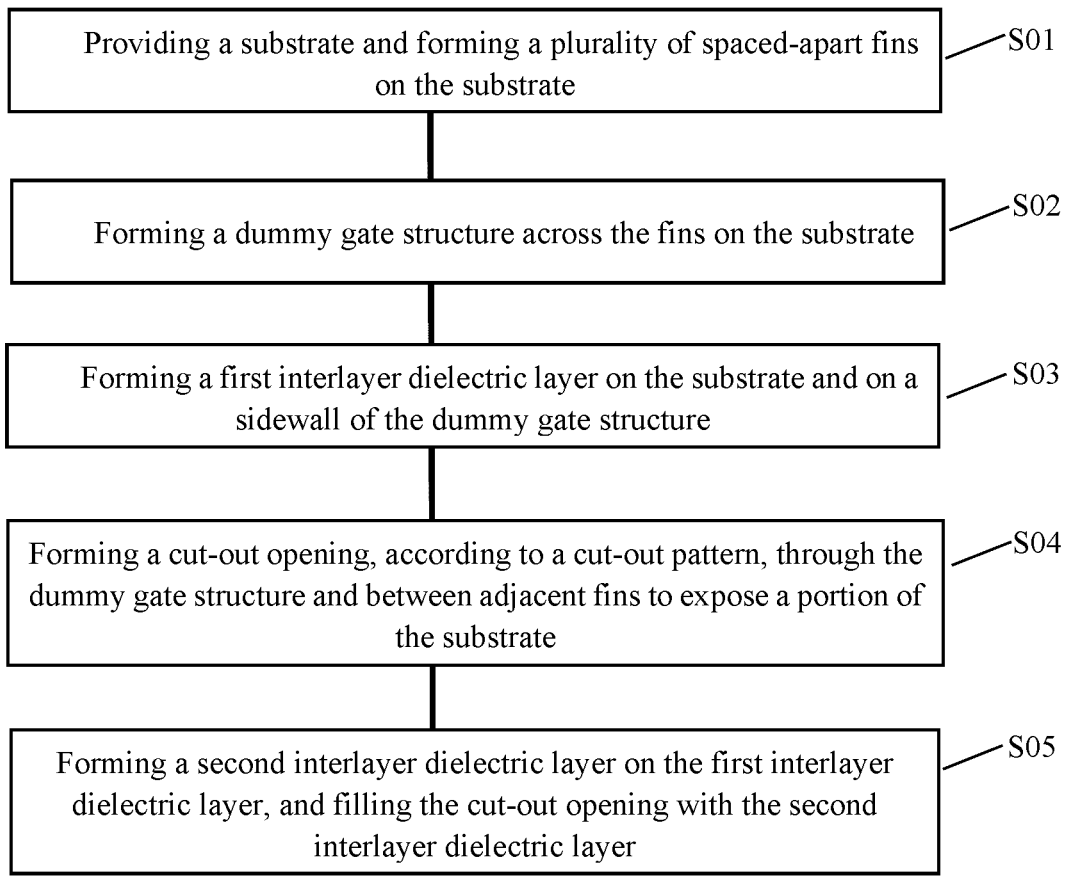
FIG. 27 illustrates an exemplary fabrication method of a semiconductor device consistent with various disclosed embodiments of the present disclosure.

FIG. 27 illustrates a flowchart of an exemplary method for fabricating a semiconductor device consistent with various disclosed embodiments in the present disclosure. FIGS. 7-14 illustrate schematic views of forming a semiconductor device at certain stages of an exemplary fabrication process in the first exemplary embodiment of the present disclosure.

Figure 7:
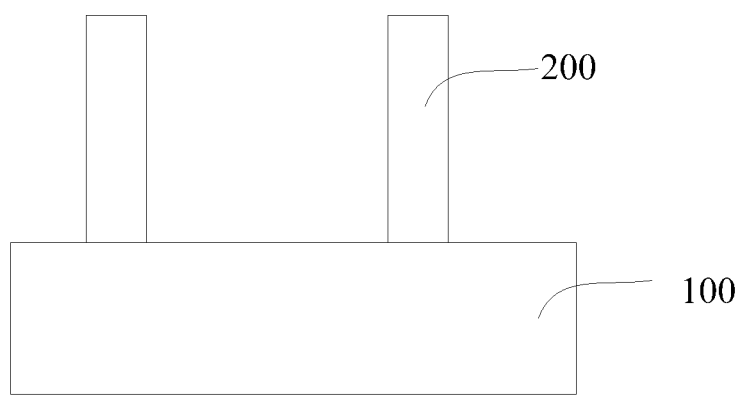
FIGS. 7-14 illustrate structures corresponding to certain stages during an exemplary fabrication process of a semiconductor device consistent with the first exemplary embodiment of the present disclosure.

Referring to FIG. 27, at the beginning of the fabrication process, a substrate is provided, and a plurality of spaced-apart fins are formed on the substrate (S01). FIG. 7 shows a schematic cross-section view of a corresponding semiconductor structure.

Referring to FIG. 7, a substrate 100 is provided. A plurality of spaced-apart fins 200 is formed on the substrate 100.

In one embodiment, the substrate 100 is made of monocrystalline silicon. In other embodiments, the substrate 100 can be made of a material including monocrystalline silicon, polycrystalline silicon, and amorphous silicon. The substrate 100 can also be made of a semiconducting material including silicon, germanium, silicon germanium, and gallium arsenide.

Forming the fins 200 includes: first forming a photoresist layer on the substrate 100; after exposure and development processes, forming a photoresist pattern in the photoresist layer; and then etching the substrate 100 using the photoresist pattern as a mask to form the fins 200 on the substrate 100.

Figure 8:
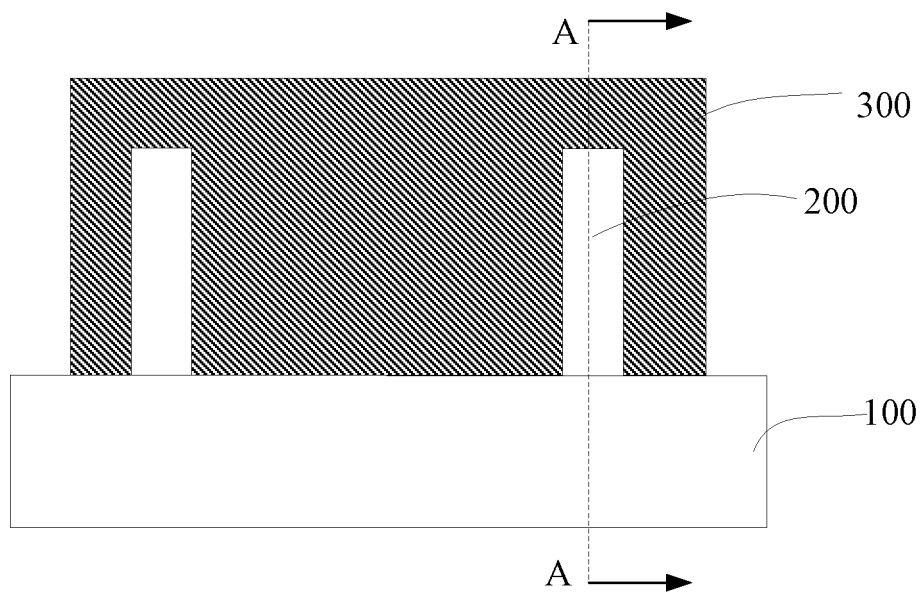
Figure 9:
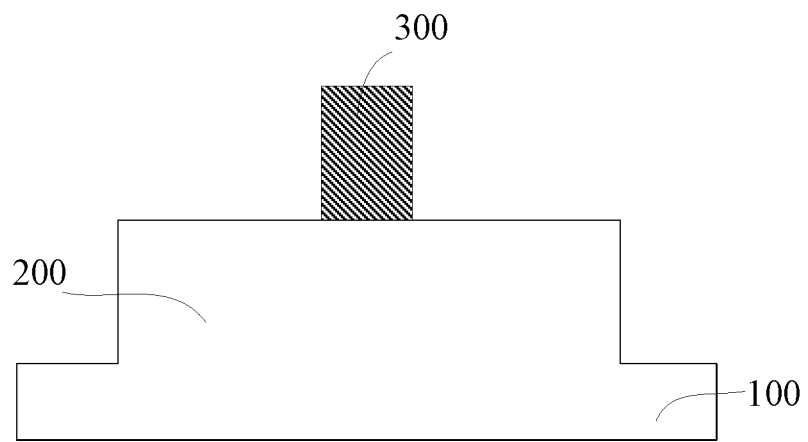

Further, returning to FIG. 27, a dummy gate structure is formed across the fins on the substrate (S02). FIGS. 8-9 show schematic cross-section views of a corresponding semiconductor structure.

Referring to FIG. 8 and FIG. 9, a dummy gate structure 300 is formed across the fins 200 on the substrate 100. FIG. 9 is a cross-sectional view of FIG. 8 along the cutting line A-A shown in FIG. 8.

Figure 16:
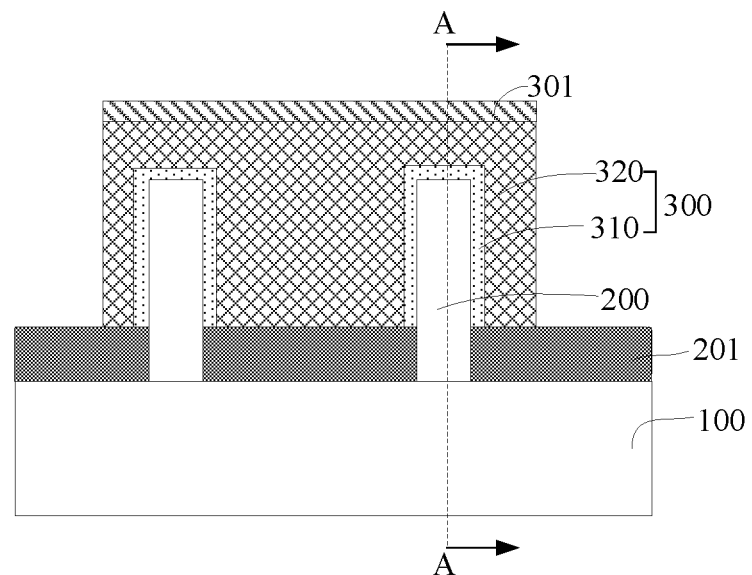

In one embodiment, the dummy gate structure 300, as also shown in for example FIG. 16, may include a gate dielectric layer 310 and a gate electrode layer 320 formed on the gate dielectric layer 310.

In some embodiments, the gate electrode layer may be made of a material including polysilicon, and the gate dielectric layer may be made of a material including amorphous carbon, silicon oxide, and/or silicon nitride.

In one embodiment, forming the dummy gate structure includes: forming a gate dielectric layer such as a gate oxide layer on the substrate, forming a gate layer on the gate oxide layer, forming a patterned layer on the gate layer, the patterned layer covering a corresponding area where the dummy gate structure needs to be formed, and using the patterned layer as a mask to etch the gate layer and the gate oxide layer until the substrate is exposed.

Figure 10:
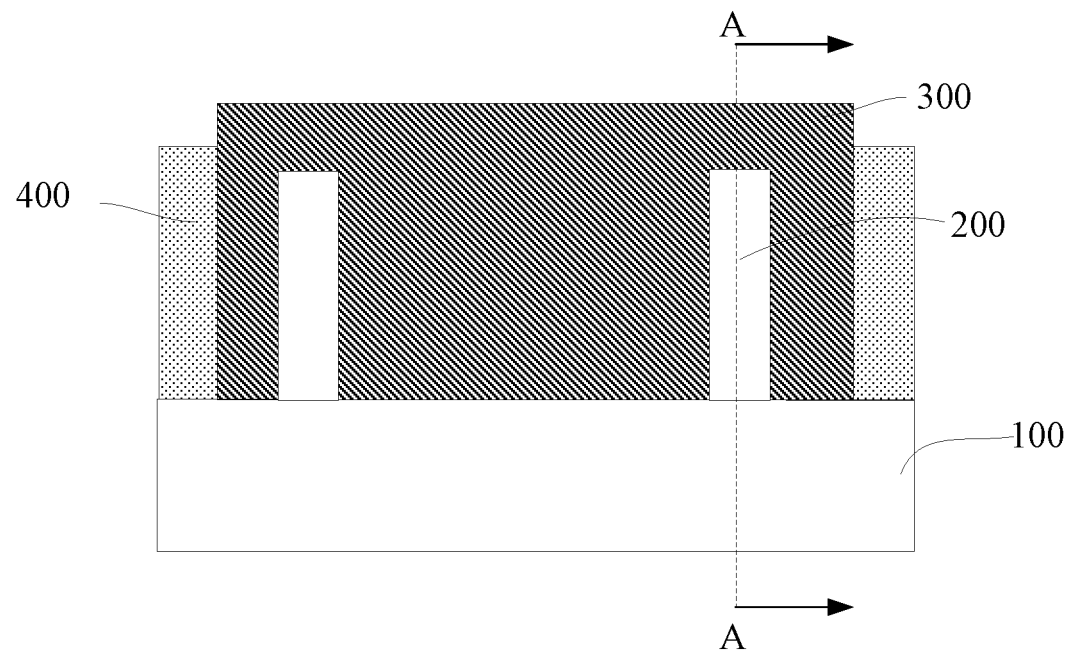
Figure 11:
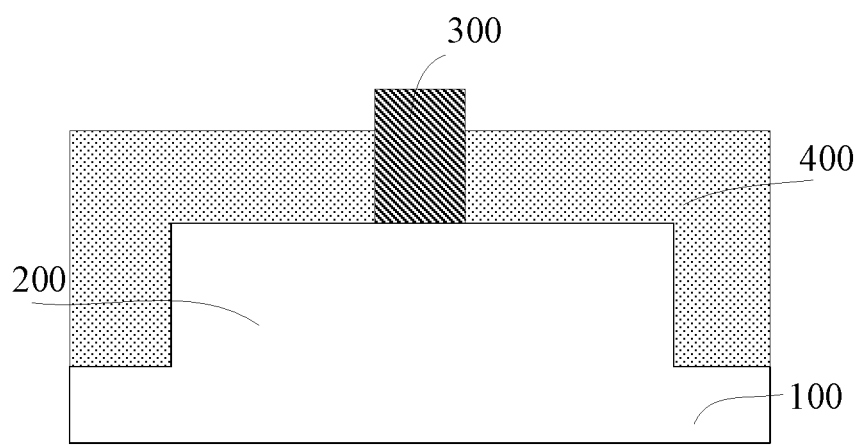

Further, returning to FIG. 27, a first interlayer dielectric layer is formed on the substrate and on a sidewall of the dummy gate structure (S03). FIGS. 10-11 show schematic cross-section views of a corresponding semiconductor structure.

Referring to FIG. 10 and FIG. 11, a first interlayer dielectric layer 400 is formed over the substrate 100. The first interlayer dielectric layer 400 is etched so that a top of the first interlayer dielectric layer 400 is lower than a top of the dummy gate structure 300 and higher than a top of the fins 200. FIG. 11 is a cross-sectional view of FIG. 10 along the cutting line A-A shown in FIG. 10.

In one embodiment, the first interlayer dielectric layer 400 is made of silicon oxide. In other embodiments, the first interlayer dielectric layer 400 can be made of a dielectric material including silicon carbide, silicon oxynitride, silicon nitride, and a dielectric polymer such as polybenzoxazole (PBO).

In one embodiment, the first interlayer dielectric layer 400 is formed using a chemical vapor deposition. During forming the first interlayer dielectric layer 400 using the chemical vapor deposition, gases used in the process include oxygen, ammonia ($NH_3$), and $N(SiH_3)_3$. The oxygen has a flow rate in a range of 20-10000 sccm, the ammonia ($NH_3$) has a flow rate in a range of 20-10000 sccm, the $N(SiH_3)_3$ has a flow rate in a range of 20-10000 sccm, a chamber pressure is in a range of 0.01-10 torr, and a temperature is in a range of 30-90° C.

In other embodiments, the first interlayer dielectric layer 400 can be formed by a method including an atomic layer deposition and a plasma-enhanced chemical vapor deposition.

In one embodiment, the first interlayer dielectric layer 400 is etched using a dry etching method until the top of the first interlayer dielectric layer 400 is lower than the top of the dummy gate structure 300. During dry etching the interlayer dielectric layer 400, gases used in the process include helium (He), ammonia ($NH_3$), and $NF_3$. The helium (He) has a flow rate in a range of 600-2000 sccm, the ammonia ($NH_3$) has a flow rate in a range of 200-5000 sccm, the $NF_3$ has a flow rate in a range of 20-2000 sccm, an etching pressure is in a range of 2-100 mtorr, and an etching time is in a range of 20-1000 s.

Figure 12:
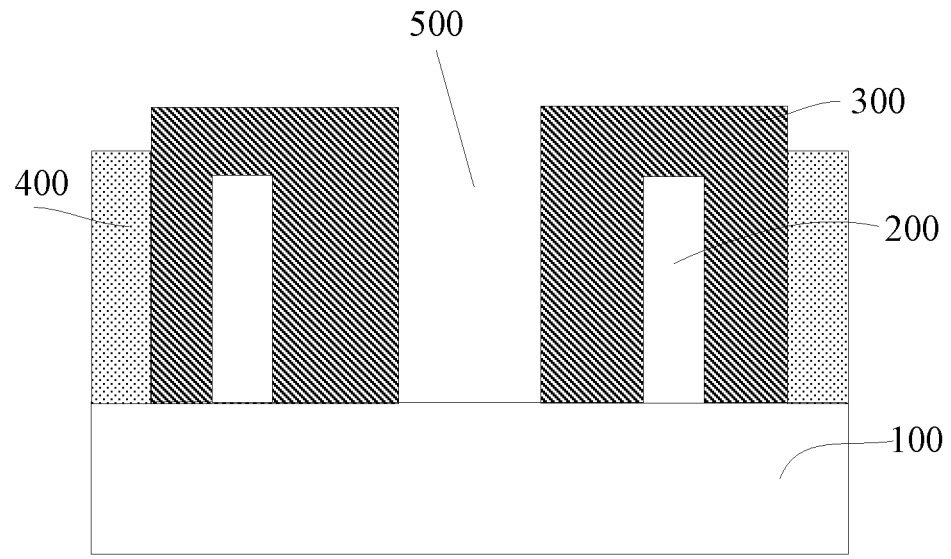

Further, returning to FIG. 27, a cut-out opening, according to a cut-out pattern, is formed through the dummy gate structure and between adjacent fins to expose a portion of the substrate (S04). FIG. 12 shows a schematic cross-section view of a corresponding semiconductor structure.

Referring to FIG. 12, along with a cut-out pattern, the dummy gate structure 300 is etched until a portion of the substrate 100 is exposed to form a cut-out opening 500.

In one embodiment, the cut-out opening 500 is located between a transfer transistor, a pull-up transistor, and a pull-down transistor.

In one embodiment, the cut-out opening 500 is formed by dry etching. In other embodiments, the cut-out opening 500 can be formed by a method including wet etching.

In one embodiment, the dry etching uses etching gases including carbon tetrafluoride and sulfur hexafluoride plus nitrogen and oxygen. The carbon tetrafluoride has a flow rate in a range of 50 sccm-2005 sccm, the sulfur hexafluoride has a flow rate in a range of 5 sccm-500 sccm, the nitrogen has a flow rate in a range of 6 sccm-300 sccm, the oxygen has a flow rate in a range of 1-250 sccm, an etching pressure is in a range of 1 mtorr-150 mtorr, an etching time is in a range of 10 s-2000 s, a voltage is in a range of 50 V-300 V, and a power is in a range of 200 W-500 W.

In one embodiment, the cut-out opening 500 has a width of 30 nm-60 nm. When the width of the cut-out opening 500 is less than 30 nm, the cut-out opening has a relatively large pressure inside, so that the interlayer dielectric layer will not be easily filled. At the same time, the interlayer dielectric layer after being filled is prone to form holes and the density is poor, causing bridging problems that affect the performance of a semiconductor device. When the width of the cut-out opening is greater than 60 nm, because the width of the cut-out opening 500 is large, it is not conducive to the formation of a highly integrated semiconductor device.

Figure 13:
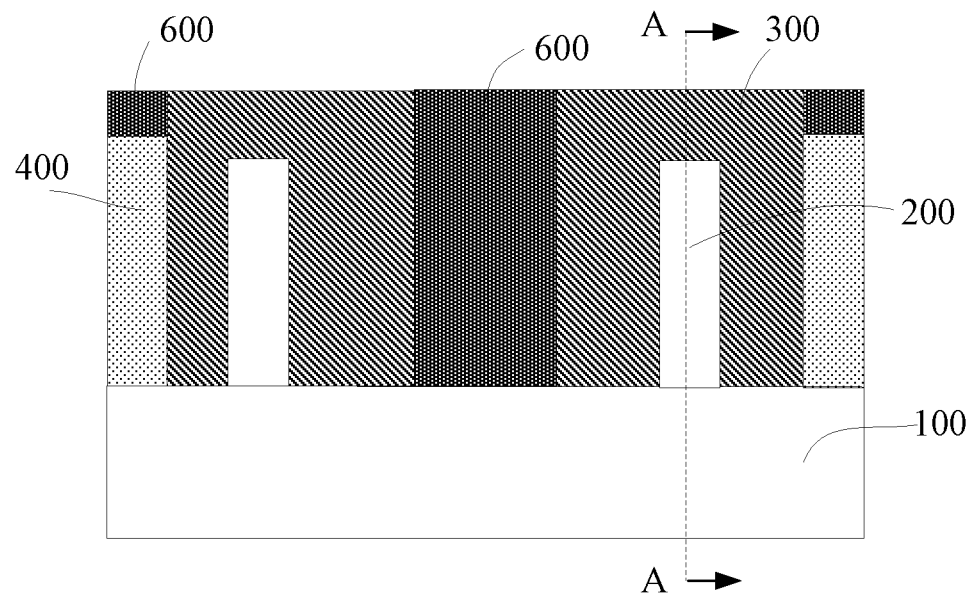
Figure 14:
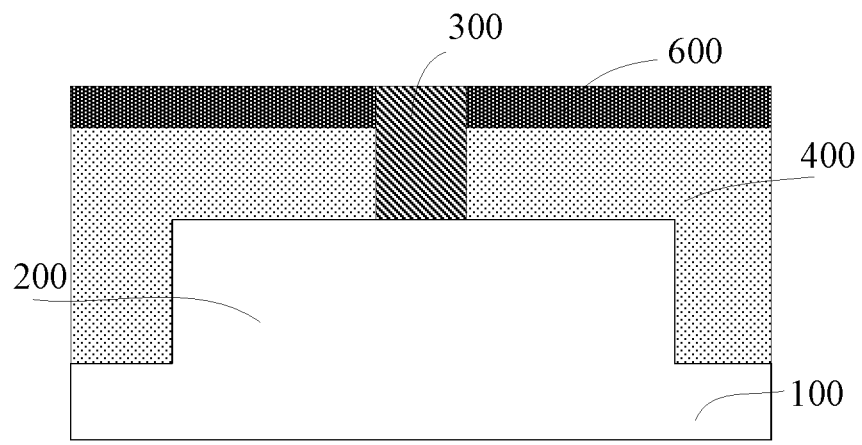

Further, returning to FIG. 27, a second interlayer dielectric layer is formed on the first interlayer dielectric layer, and the second interlayer dielectric layer fills in the cut-out opening (S05). FIGS. 13 and 14 show schematic cross-section views of a corresponding semiconductor structure.

Referring to FIG. 13 and FIG. 14, a second interlayer dielectric layer 600 is formed on the first interlayer dielectric layer 400, and the second interlayer dielectric layer 600 fills in the cut-out opening 500. A top of the second interlayer dielectric layer 600 is co-planar with the top of the dummy gate structure 300. FIG. 14 is a cross-sectional view of FIG. 13 along the cutting line A-A shown in FIG. 13.

In one embodiment, the existence of the cut-out opening 500 provides sufficient space for performing the filling of the second interlayer dielectric layer 600, so that the second interlayer layer 600 formed in the cut-out opening 500 may have good quality. Since the cut-out opening 500 provides a sufficiently large space for performing the filling of the second interlayer dielectric layer 600, the air pressure inside the cut-out opening 500 is small. During the filling of the second interlayer dielectric layer 600, the gas inside the cut-out opening 500 has little effect on the second interlayer dielectric layer 600, which facilitates the formation of the second interlayer dielectric layer 600 with good compactness. The problems of leakage or bridging caused by holes formed in existing second interlayer dielectric layer may be avoided, which improves the quality and stability of a semiconductor device.

In one embodiment, the second interlayer dielectric layer 600 is made of silicon oxide. In other embodiments, the second interlayer dielectric layer 600 can be made of a dielectric material including silicon carbide, silicon oxynitride, silicon nitride, and a dielectric polymer such as polybenzoxazole (PBO).

In one embodiment, the material of the second interlayer dielectric layer 600 is the same as that of the first interlayer dielectric layer 400. In other embodiments, the material of the second interlayer dielectric layer 600 may be different from the material of the first interlayer dielectric layer 400.

In one embodiment, the second interlayer dielectric layer 600 is formed using a chemical vapor deposition. During forming the second interlayer dielectric layer 600 using the chemical vapor deposition, gases used in the process include oxygen, ammonia ($NH_3$), and $N(SiH_3)_3$. The oxygen has a flow rate in a range of 20 sccm-10000 sccm, the ammonia ($NH_3$) has a flow rate in a range of 20 sccm-10000 sccm, the $N(SiH_3)_3$ has a flow rate in a range of 20 sccm-10000 sccm, a chamber pressure is in a range of 0.01 torr-10 torr, and a temperature is in a range of 30° C.-90° C.

In other embodiments, the second interlayer dielectric layer 600 can be formed by a physical method such as atomic layer deposition.

In one embodiment, after forming the second interlayer dielectric layer 600, it is planarized by chemical mechanical grinding. In other embodiments, a mechanical grinding process can be used to make the top of the second interlayer dielectric layer 600 to be co-planar with the top of the dummy gate structure 300.

In one embodiment, the reason for using the chemical mechanical grinding is that the chemical mechanical grinding combines the advantages of both chemical grinding and mechanical grinding, which can ensure obtaining the second interlayer dielectric layer 600 with high surface smoothness, thus promoting the quality of a semiconductor device.

A semiconductor device formed by using the aforementioned method includes a substrate 100; a plurality of spaced-apart fins 200 on the substrate 100; a dummy gate structure 300 on the substrate 100 across the fins 200; a first interlayer dielectric layer 400 located on the substrate 100 and on the sidewall of the dummy gate structure 300, and the top of the first interlayer dielectric layer being lower than the top of the dummy gate structure 300 and higher than the top of the fins 200; a cut-out opening 500 located inside the dummy gate structure 300; and a second interlayer dielectric layer 600 located on the first interlayer dielectric layer 400 and filling in the cut-out opening 500.

FIGS. 15-26 illustrate schematic views of forming a semiconductor device at certain stages of an exemplary fabrication process in the second exemplary embodiment of the present disclosure.

Figure 15:
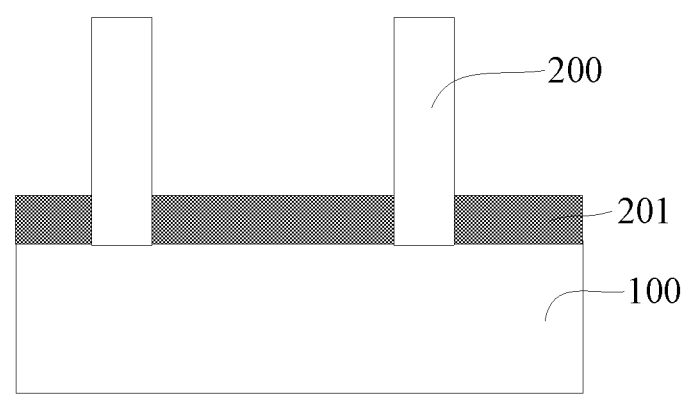
FIGS. 15-26 illustrate structures corresponding to certain stages during an exemplary fabrication process of a semiconductor device consistent with the second exemplary embodiment of the present disclosure.

Referring to FIG. 15, a substrate 100 is provided. A plurality of spaced-apart fins 200 and an isolation structure 201 are formed on the substrate 100.

Forming the fins 200 in the second exemplary embodiment is the same as forming the fins 200 in the first exemplary embodiment of the present disclosure.

In one embodiment, the isolation structure 201 is formed on the substrate 100. In other embodiments, the isolation structure 201 may not be formed on the substrate 100.

In one embodiment, the isolation structure 201 is made of silicon oxynitride. In other embodiments, the isolation structure 201 can be made of a combination of one or more of silicon oxide, silicon nitride, silicon oxycarbide, silicon carbon nitride, and silicon oxycarbonitride.

In one embodiment, the isolation structure 201 is a shallow isolation structure.

In one embodiment, the isolation structure 201 is used in a subsequent etching process as an etching stop layer.

Forming the isolation structure 201 includes: forming an isolation structure film (not shown) covering the fins 200 on the substrate 100; and back-etching the isolation structure film to form the isolation structure 201.

The isolation structure film is formed by using a deposition process including a fluid chemical vapor deposition process. Using the fluid chemical vapor deposition process to form the isolation structure film can promote the filling of the isolation structure film.

Using the fluid chemical vapor deposition process to form the isolation structure film includes: forming an isolation fluid layer on the substrate 100 and performing a water vapor annealing to make the isolation fluid layer form an isolation structure film.

The water vapor annealing uses gases including oxygen, ozone, and gaseous water. The annealing temperature is 350° C. to 750° C.

Figure 17:
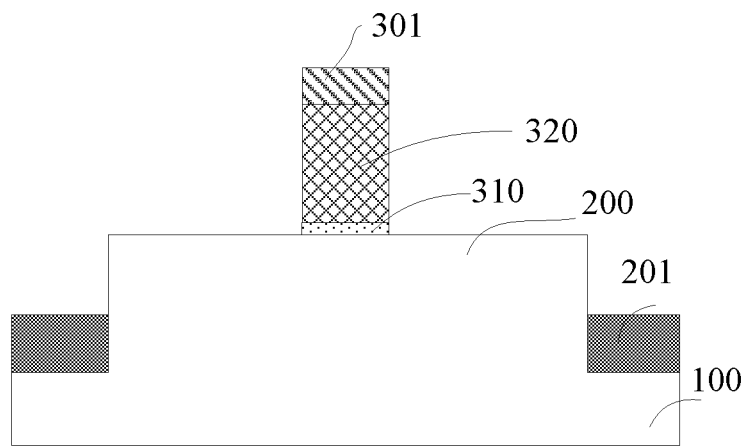

Referring to FIGS. 16 and 17, a dummy gate structure 300 across the fins 200 is formed on the substrate 100, and a mask layer 301 is formed on the dummy gate structure 300. FIG. 17 is a cross-sectional view of FIG. 16 along the cutting line A-A shown in FIG. 16.

In one embodiment, the mask layer 301 is formed on the dummy gate structure 300. In other embodiments, the mask layer 301 may not be formed on the dummy gate structure 300.

In one embodiment, the mask layer 301 is made of silicon carbide. In other embodiments, the mask layer 301 can be made of a material including silicon oxide and silicon nitride.

Figure 18:
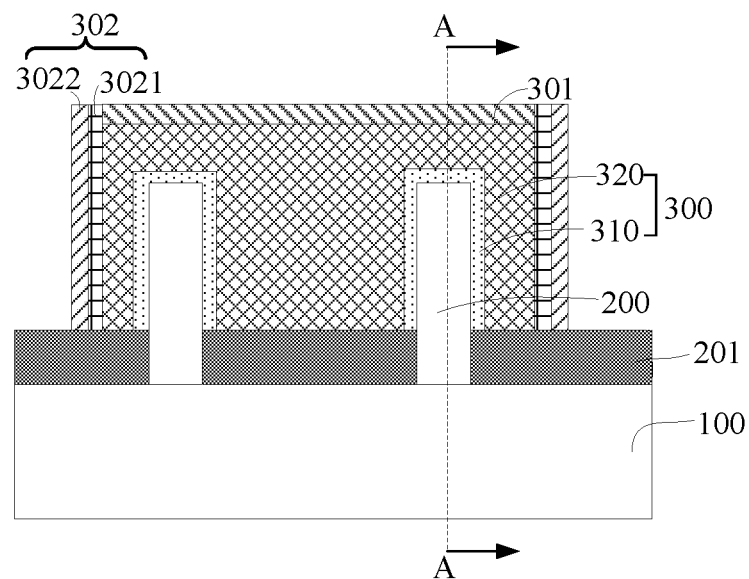
Figure 19:
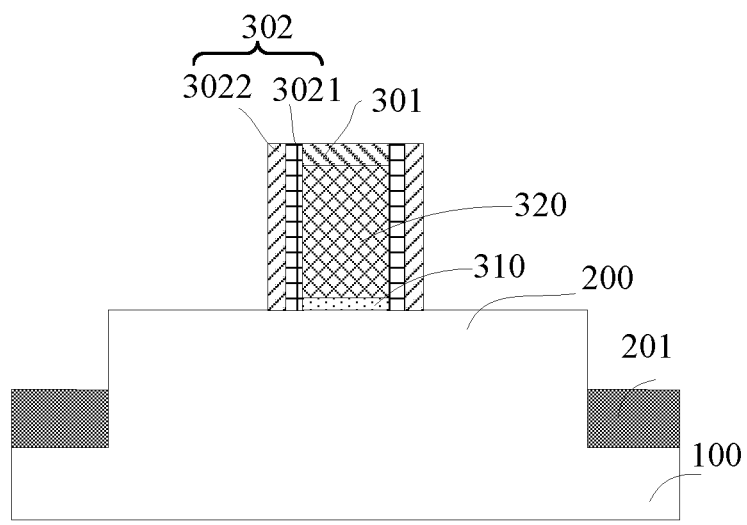

Referring to FIGS. 18 and 19, a sidewall spacer 302 is formed on a sidewall of the dummy gate structure 300. FIG. 19 is a cross-sectional view of FIG. 18 along the cutting line A-A shown in FIG. 18.

In one embodiment, after forming the dummy gate structure 300, it also includes forming the sidewall spacer 302 on the sidewall of the dummy gate structure 300. In other embodiments, the sidewall spacer 302 may not be formed on the sidewall of the dummy gate structure 300.

The sidewall spacer 302 is used to define the position of a subsequently formed source-drain doped layer. The sidewall spacer 302 is also used to protect the sidewall of the dummy gate structure 300 and to prevent the formation of defects in a subsequently formed gate layer, which affects the electrical performance of a semiconductor device.

In one embodiment, the sidewall spacer 302 includes a first sidewall spacer 3021 and a second sidewall spacer 3022. The first sidewall spacer 3021 is located on the sidewall of the dummy gate structure 300 and on the sidewall of the mask layer 301. The second sidewall spacer 3022 is located on the sidewall of the first sidewall spacer 3021. The first sidewall spacer 3021 is used to define the position of a lightly doped region. The first sidewall spacer 3021 and the second sidewall spacer 3022 are used to define the position of the source-drain doped layer. In other embodiments, the sidewall spacer 302 can be formed as a single-layer structure.

In one embodiment, the sidewall spacer 302 uses a multi-layer structure. In other embodiments, the sidewall spacer 302 can use a single-layer structure.

In one embodiment, the first sidewall spacer 3021 and the second sidewall spacer 3022 are made of different materials.

In one embodiment, the first sidewall spacer 3021 is made of silicon oxynitride. In other embodiments, the first sidewall spacer 3021 can be made of a material including silicon oxide, silicon oxycarbide, silicon carbonitride, and silicon oxycarbonitride.

In one embodiment, the second sidewall spacer 3022 is made of silicon oxycarbide. In other embodiments, the second sidewall spacer 3022 can be made of a material including silicon oxide, silicon oxynitride, silicon nitride, and silicon oxycarbonitride.

In one embodiment, the first sidewall spacer 3021 has a thickness of 1-7 nm.

In one embodiment, the second sidewall spacer 3022 has a thickness of 6-15 nm.

Figure 20:
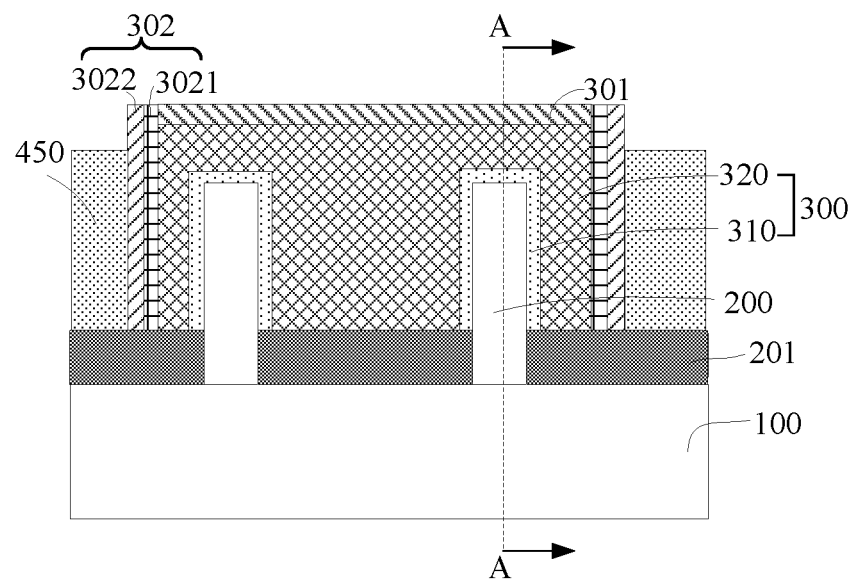
Figure 21:
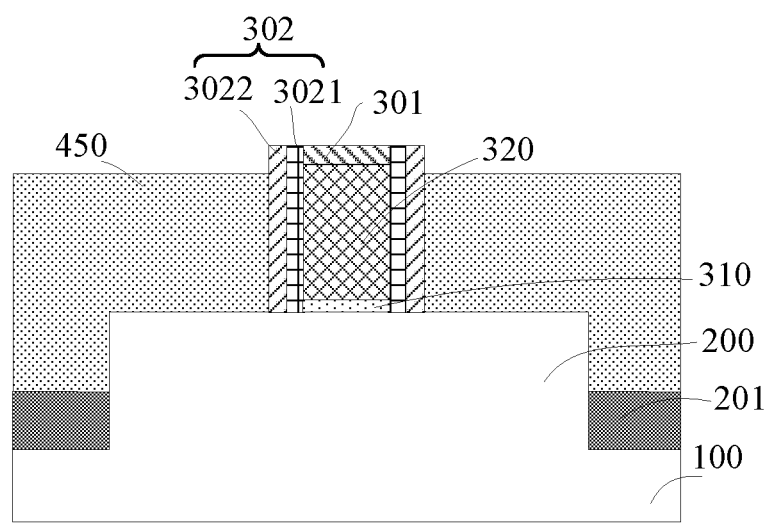

Referring to FIGS. 20-21, a first interlayer dielectric layer 450 is formed on the substrate 100, and the first interlayer dielectric layer 450 is etched so that a top of the first interlayer dielectric layer 450 is lower than a top of the sidewall 302 and higher than the top of fins 200. FIG. 21 is a cross-sectional view of FIG. 20 along the cutting line A-A shown in FIG. 20.

In one embodiment, the first interlayer dielectric layer 450 is formed by an atomic layer deposition method. In other embodiments, a chemical vapor deposition method or a physical vapor deposition method can be used.

In one embodiment, the first interlayer dielectric layer 450 is made of silicon carbide. In other embodiments, other dielectric materials can be used, including silicon oxide, silicon oxynitride, silicon nitride, and dielectric polymers such as polybenzoxazole (PBO).

Figure 22:
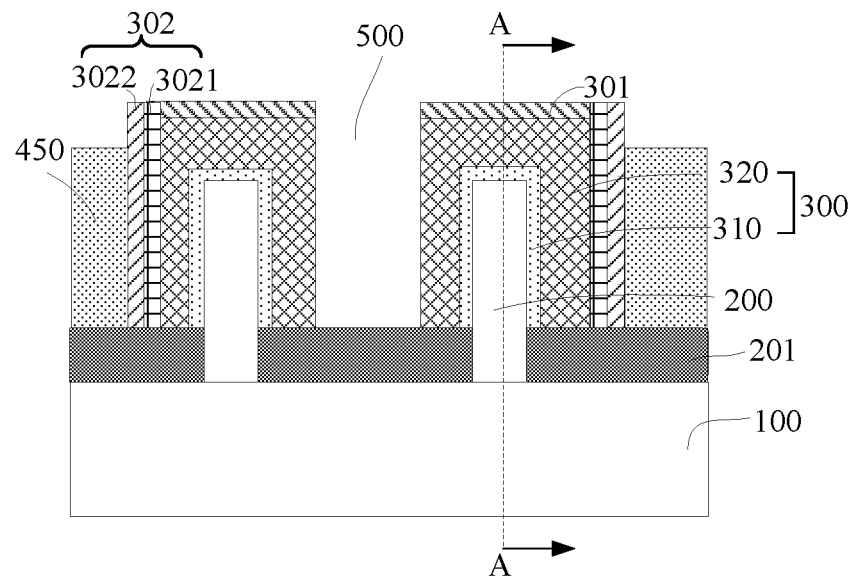

Referring to FIG. 22, along with a cut-out pattern, the dummy gate structure 300 is etched until a portion of the isolation structure 201 over the substrate 100 is exposed to form a cut-out opening 500.

In one embodiment, forming the cut-out opening 500 is the same as that in the first exemplary embodiment.

Figure 23:
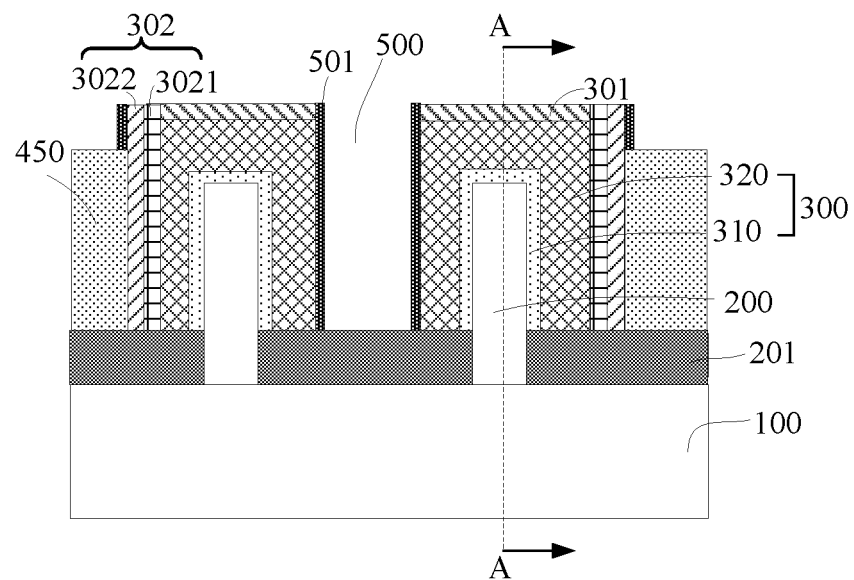
Figure 24:
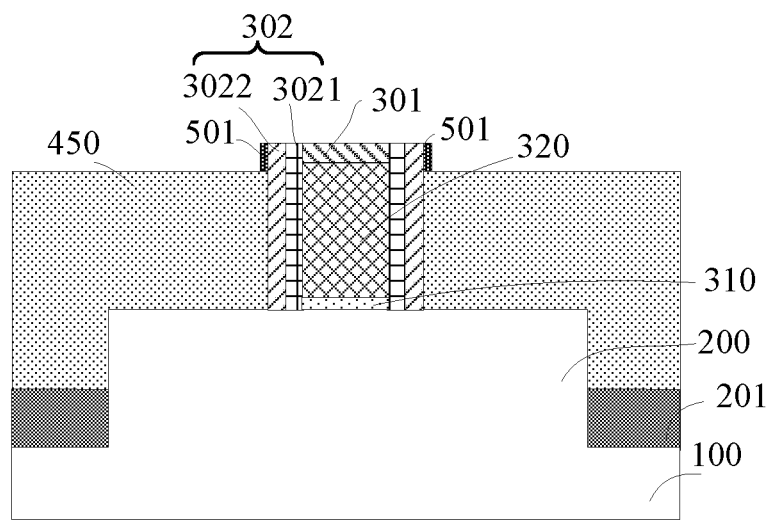

Referring to FIGS. 23-24, an insulating layer 501 is formed on a sidewall of the second sidewall spacer 3022 and on a sidewall of the cut-out opening 500. FIG. 24 is a cross-sectional view of FIG. 23 along the cutting line A-A shown in FIG. 23.

In one embodiment, the insulating layer 501 is formed on the sidewall of the cut-out opening 500 and on the sidewall of the second sidewall spacer 3022. In other embodiments, the insulating layer 501 may not be formed.

In one embodiment, the presence of the insulating layer 501 increases the distance between a contact plug and a metal gate, thereby improving the bridging problem and enhancing the stability and performance of a semiconductor device.

In one embodiment, the insulating layer 501 has a thickness of 3 nm-20 nm. When the thickness of the insulating layer 501 is less than 3 nm, the distance between the contact plug and the metal gate is too small, at the same time, a process window also becomes too small, which is not conducive to the formation of a stable semiconductor device. When the thickness of the insulating layer 501 is greater than 20 nm, the insulating layer 501 is too thick, which may cause problems when filling the insulating layer 501. At the same time, it also wastes materials.

In one embodiment, the insulating layer 501 uses a single-layer structure. In other embodiments, the insulating layer 501 can use a multi-layer structure.

In one embodiment, the insulating layer 501 is made of silicon nitride. In other embodiments, when the insulating layer 501 uses the single-layer structure, the insulating layer 501 can be made of a material including silicon oxynitride, boron-containing silicon carbonitride, and silicon carbonitride. When the insulating layer 501 uses the multi-layer structure, the insulating layer 501 can be made of a combination of one or more of silicon nitride, silicon oxynitride, boron-containing silicon carbonitride, and silicon carbonitride.

In one embodiment, a chemical vapor deposition method is used to deposit a material for forming the insulating layer 501. The chemical vapor deposition method uses gases including a DCS gas doped with $SiH_2Cl_2$ or ammonia gas ($NH_3$) at a flow rate of 1500 sccm-4000 sccm. During the chemical vapor deposition, a temperature is in a range of 200° C.-600° C. and an etching pressure is in a range of 1 mtorr-10 mtorr.

In one embodiment, the material for forming the insulating layer 501 is etched to form the insulating layer 501 until the substrate 100 is exposed. During etching, carbon tetrafluoride ($CF_4$), $CH_3F$, and oxygen ($O_2$) are used as an etching atmosphere. The carbon tetrafluoride ($CF_4$) has a flow rate of 5 sccm-100 sccm, the $CH_3F$ has a flow rate of 8 sccm-250 sccm, and the oxygen ($O_2$) has a flow rate of 10 sccm-400 sccm. A source RF power used for etching is in a range of 50 W-300 W, a voltage is in a range of 30 V-100 V; an etching treatment time is in a range of 4 s-50 s, and an etching pressure is in a range of 10 mtorr-2000 mtorr.

Figure 25:
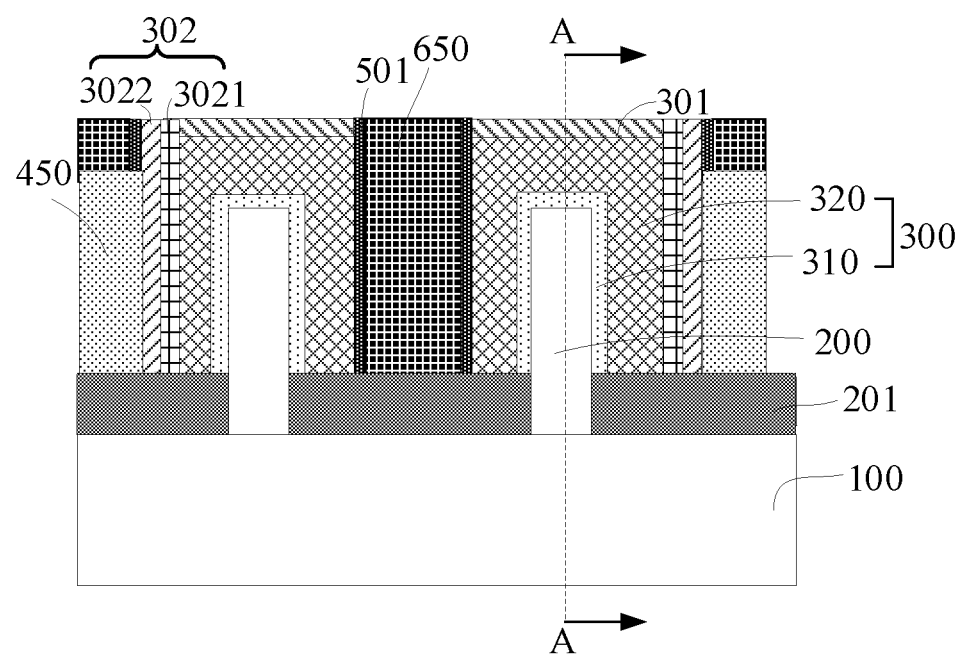
Figure 26:
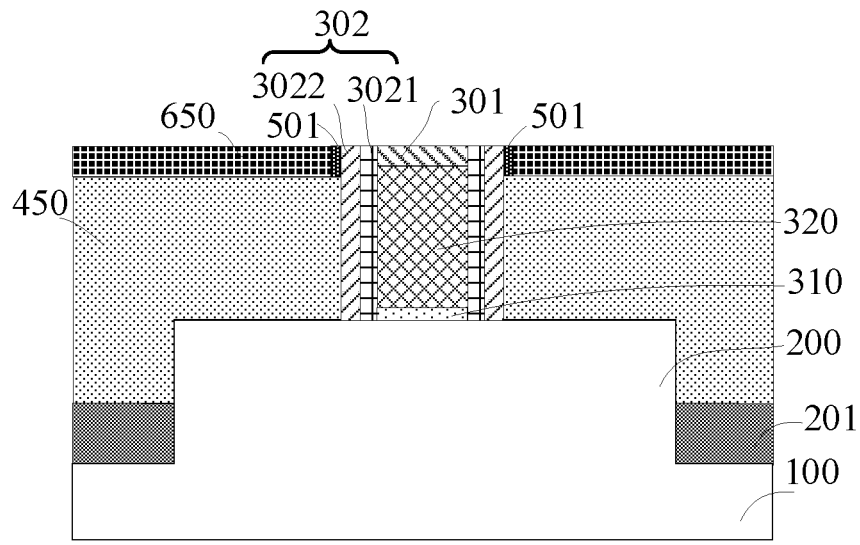

Referring to FIGS. 25-26, a second interlayer dielectric layer 650 is formed on the first interlayer dielectric layer 450, and the second interlayer dielectric layer 650 fills in the cut-out opening 500. A top of the second interlayer dielectric layer 650 is co-planar with a top of the mask layer 301. FIG. 26 is a cross-sectional view of FIG. 25 along the cutting line A-A shown in FIG. 25.

In one embodiment, the second interlayer dielectric layer 650 is made of silicon oxide. In other embodiments, the second interlayer dielectric layer 650 can be made of a dielectric material including silicon carbide, silicon oxynitride, silicon nitride, and a dielectric polymer such as polybenzoxazole (PBO).

In one embodiment, the second interlayer dielectric layer 650 is formed by a chemical vapor deposition.

In other embodiments, the second interlayer dielectric layer 650 can be formed by other methods including an atomic layer deposition, a plasma-enhanced chemical vapor deposition, and a physical method.

In one embodiment, after forming the second interlayer dielectric layer 650, it is planarized by chemical mechanical grinding. In other embodiments, a mechanical grinding process can be used to make the top of the second interlayer dielectric layer 650 to be co-planar with the top of the mask layer 301.

A semiconductor device formed by using the aforementioned method includes a substrate 100; a plurality of spaced-apart fins 200 on the substrate 100; an isolation structure 201 on the substrate 100; a dummy gate structure 300 on the substrate 100 across the fins 200; a mask layer 301 on the dummy gate structure 300; a first sidewall spacer 3021 located on a sidewall of the dummy gate structure 300 and on a sidewall of the mask layer 301; a second sidewall spacer 3022 located on a sidewall of the first sidewall spacer 3021; a first interlayer dielectric layer 400/450 located on the substrate 100 and on the sidewall of the second sidewall spacer 3022, and the top of the first interlayer dielectric layer being lower than the top of the second sidewall spacer 3022; a cut-out opening 500 located inside the dummy gate structure 300; an insulating layer 501 located on a sidewall of the cut-out opening 500 and on the sidewall of the second sidewall spacer 3022; and a second interlayer dielectric layer 600/650 located on the first interlayer dielectric layer 400/450 and filling in the cut-out opening 500.

The present disclosure provides a semiconductor device and a method of forming the same to improve the performance of semiconductor devices. As disclosed, the technical solutions of the present disclosure have the following advantages.

After the cut-out opening pattern is defined, the cut-out opening is formed inside the dummy gate structure. When the cut-out opening is filled with the second interlayer dielectric layer, bridging on the sidewall of the cut-out opening can be avoided. This is because the existence of the cut-out opening provides enough space for the filling of the second interlayer dielectric layer. The cut-out opening is large enough, so that during the filling of the second interlayer dielectric layer, the gas inside the cut-out opening has little effect on the second interlayer dielectric layer, which facilitates the filling of the second interlayer dielectric layer. At the same time, when filling the cut-out opening, the second interlayer dielectric layer encounters a small gas force, which can prevent the second interlayer dielectric layer from forming holes during filling the cut-out opening, thus avoiding current leakage and bridging problems due to the presence of holes, and thereby improving the performance and stability of a semiconductor device.

Further, the insulating layer is formed on the sidewall of the dummy gate structure and on the sidewall of the cut-out opening. Due to the presence of the insulating layer, the distance between the contact plug and the metal gate can be increased in subsequent processing, thereby improving bridging problems between the contact plug and the metal gate.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of forming a semiconductor device, comprising:
    providing a substrate;
    forming a plurality of spaced-apart fins on the substrate;
    forming a dummy gate structure across the fins over the substrate;
    forming a first interlayer dielectric layer on the substrate and on a sidewall of the dummy gate structure, wherein a top of the first interlayer dielectric layer is lower than a top of the dummy gate structure and higher than the top of the fins;
    forming a cut-out opening, according to a cut-out pattern, passing through the dummy gate structure and between adjacent fins;
    forming an insulating layer on the sidewall of the dummy gate structure and on a sidewall of the cut-out opening, wherein the insulating layer includes a first portion on the top of the first interlayer dielectric layer and located at a side of the dummy gate structure away from the cut-out opening in a direction perpendicular to an extension direction of the plurality of spaced-apart fins and a second portion on the sidewall of the cut-out opening; and
    forming a second interlayer dielectric layer on the first interlayer dielectric layer and filling in the cut-out opening with the second interlayer dielectric layer.

2. The method according to claim 1, prior to forming the dummy gate structure, further including:
    forming an isolation structure on the substrate between adjacent fins and covering a sidewall portion of each fin, wherein the cut-out opening passing through the dummy gate structure exposes a portion of the isolation structure.

3. The method according to claim 1, wherein the cut-out opening is formed by a dry etching that uses carbon tetrafluoride, sulfur hexafluoride plus nitrogen and oxygen as an etching atmosphere, wherein the carbon tetrafluoride has a flow rate in a range of 50 sccm-2005 sccm, the sulfur hexafluoride has a flow rate in a range of 5 sccm-500 sccm, the nitrogen has a flow rate in a range of 6 sccm-300 sccm, the oxygen has a flow rate in a range of 1 sccm-250 sccm, an etching pressure is in a range of 1 mtorr-150 mtorr, an etching time is in a range of 10 s-2000 s, a voltage is in a range of 50 V-300 V, and a power is in a range of 200 W-500 W.

4. The method according to claim 1, wherein:
    the insulating layer is formed before forming the second interlayer dielectric layer.

5. The method according to claim 4, wherein the insulating layer includes a single-layer structure or a multi-layer structure.

6. The method according to claim 5, wherein when the single-layer structure is used for the insulating layer, the insulating layer is made of a material including silicon nitride, silicon oxynitride, or silicon carbonitride.

7. The method according to claim 1, wherein the first interlayer dielectric layer is made of a material including silicon oxide, silicon carbide, silicon oxynitride, silicon nitride, or a combination thereof.

8. The method according to claim 7, wherein the first interlayer dielectric layer is formed by a method including a chemical vapor deposition or an atomic layer deposition.

9. The method according to claim 1, wherein the second interlayer dielectric layer is made of a material including silicon oxide, silicon carbide, silicon oxynitride, silicon nitride, or a combination thereof.

10. The method according to claim 9, wherein the second interlayer dielectric layer is formed by a method including a chemical vapor deposition, an atomic layer deposition, or a physical vapor deposition.

11. A method of forming a semiconductor device, comprising:
provid ing a substrate;
forming a plurality of spaced-apart fins on the substrate;
forming a dummy gate structure across the fins over the substrate;
forming a first interlayer dielectric layer on the substrate and on a sidewall of the dummy gate structure, wherein a top of the first interlayer dielectric layer is lower than a top of the dummy gate structure and higher than the top of the fins;
forming a cut-out opening, according to a cut-out pattern, passing through the dummy gate structure and between adjacent fins;
forming an insulating layer on the sidewall of the dummy gate structure and on the sidewall of the cut-out opening before forming a second interlayer dielectric layer; and
forming the second interlayer dielectric layer on the first interlayer dielectric layer and filling in the cut-out opening with the second interlayer dielectric layer, wherein
the insulating layer includes a multi-layer structure; and
when the multi-layer structure is used for the insulating layer, the insulating layer is made of a combination of one or more of silicon nitride, silicon oxynitride, and silicon carbonitride.

12. A semiconductor device, comprising:
a substrate;
a plurality of spaced-apart fins on the substrate;
a dummy gate structure across the fins over the substrate, wherein the dummy gate structure includes a cut-out opening between adjacent fins;
a first interlayer dielectric layer on the substrate and on a sidewall of the dummy gate structure, wherein a top of the first interlayer dielectric layer is lower than a top of the dummy gate structure and higher than a top of the fins;
an insulating layer formed on the sidewall of the dummy gate structure and on a sidewall of the cut-out opening, wherein the insulating layer includes a first portion on the top of the first interlayer dielectric layer and located at a side of the dummy gate structure away from the cut-out opening in a direction perpendicular to an extension direction of the plurality of spaced-apart fins and a second portion on the sidewall of the cut-out opening; and
a second interlayer dielectric layer on the first interlayer dielectric layer and filling in the cut-out opening through the dummy gate structure between the adjacent fins.

13. The device according to claim 12, further including:
an isolation structure formed on the substrate between adjacent fins and covering a sidewall portion of each fin, wherein:
the dummy gate structure is formed on the isolation structure, and
the second interlayer dielectric layer formed on the first interlayer dielectric layer is further formed on the isolation structure between adjacent fins.

14. The device according to claim 12, wherein the insulating layer includes a single-layer structure or a multi-layer structure.

15. The device according to claim 12, wherein the insulating layer is made of a material including silicon nitride, silicon oxynitride, silicon carbonitride, or a combination thereof.

16. The device according to claim 12, wherein the first interlayer dielectric layer is made of a material including silicon oxide, silicon carbide, silicon oxynitride, silicon nitride, or a combination thereof.

17. The device according to claim 12, wherein the second interlayer dielectric layer is made of a material including silicon oxide, silicon carbide, silicon oxynitride, silicon nitride, or a combination thereof.

18. The device according to claim 12, wherein a top of the second interlayer dielectric layer is co-planar with the top of the dummy gate structure.

19. The device according to claim 12, wherein a top of the second interlayer dielectric layer is coplanar with a top of a mask layer formed over the dummy gate structure.

* * * * *